(12) United States Patent
Puri (10) Patent No.: US 8,375,965 B2
(45) Date of Patent: Feb. 19, 2013

(54) SYSTEMS AND METHODS FOR SINGLE INTEGRATED SUBSTRATE CLEANING AND RINSING

(75) Inventor: Suraj Puri, Los Altos, CA (US)

(73) Assignee: Nano OM, LLC, Los Altos, CA (US)

( * ) Notice: Subject to any disclaimer, the term of this patent is extended or adjusted under 35 U.S.C. 154(b) by 109 days.

(21) Appl. No.: 11/944,478

(22) Filed: Nov. 23, 2007

(65) Prior Publication Data

US 2008/0156355 A1 Jul. 3, 2008

Related U.S. Application Data

(60) Division of application No. 11/093,904, filed on Mar. 29, 2005, now Pat. No. 7,731,800, and a continuation-in-part of application No. 10/866,785, filed on Jul. 7, 2004, now Pat. No. 7,655,094.

(51) Int. Cl.
*B08B 3/00* (2006.01)
*B08B 3/12* (2006.01)

(52) U.S. Cl. ........ 134/198; 134/94.1; 134/108; 134/201

(58) Field of Classification Search .................. None
See application file for complete search history.

(56) References Cited

U.S. PATENT DOCUMENTS

| | | | |
|---|---|---|---|
| 4,837,007 A | 6/1989 | Duckworth et al. | |
| 5,090,432 A | 2/1992 | Bran | |
| 5,476,384 A | 12/1995 | Giuliani et al. | |
| 5,800,576 A | 9/1998 | Johnson et al. | |
| 5,810,037 A | 9/1998 | Sasaki et al. | |
| 5,919,311 A | 7/1999 | Shive et al. | |
| 5,954,885 A | 9/1999 | Ohmi | |
| 6,378,534 B1 | 4/2002 | Olesen et al. | |
| 6,450,181 B1 | 9/2002 | Morita et al. | |
| 6,568,408 B2 | 5/2003 | Mertens et al. | |
| 6,615,854 B1 | 9/2003 | Hongo et al. | |
| 6,681,781 B2 | 1/2004 | Puri et al. | |
| 6,800,142 B1 | 10/2004 | Tipton et al. | |
| 6,982,006 B1* | 1/2006 | Boyers et al. ............. | 134/3 |
| 7,007,333 B1 | 3/2006 | Mikhaylichenko et al. | |
| 2002/0007840 A1* | 1/2002 | Atoh ....................... | 134/1.3 |
| 2002/0011253 A1* | 1/2002 | Puri et al. ................ | 134/1 |
| 2003/0000548 A1 | 1/2003 | Tsuga et al. | |
| 2003/0010356 A1 | 1/2003 | Kuyel | |
| 2003/0045098 A1 | 3/2003 | Verhaverbeke et al. | |
| 2003/0205240 A1* | 11/2003 | Bergman ................... | 134/3 |
| 2004/0012104 A1* | 1/2004 | Ozawa et al. ............. | 261/122.1 |
| 2004/0063074 A1 | 4/2004 | Fisher | |

(Continued)

FOREIGN PATENT DOCUMENTS

WO WO 00/24687 5/2000
WO WO/2006/010052 1/2006

OTHER PUBLICATIONS

Lo, S., "Anomalous State of Ice", Modern Physics Letters B, (1996) vol. 10, No. 19, pp. 909-919.

(Continued)

*Primary Examiner* — Michael Kornakov
*Assistant Examiner* — Nicole Blan
(74) *Attorney, Agent, or Firm* — EcoTech Law Group, P.C.

(57) ABSTRACT

Inventive methods and systems of cleaning patterned integrated circuit ("IC") substrates are described. The cleaning methods of the present invention include: (1) providing the patterned integrated circuit substrate having thereon poly silicon lines adjacent to each other; (2) charging a solution, which contains at least a solute selected to promote cleaning of the patterned integrated circuit substrate, to produce a charged solution, wherein at least a portion of the solute is present as clusters in the charged solution; and (3) conveying the charged solution for cleaning the patterned integrated circuit substrate.

20 Claims, 5 Drawing Sheets

U.S. PATENT DOCUMENTS

| | | | |
|---|---|---|---|
| 2004/0069330 A1* | 4/2004 | Rolfson | 134/109 |
| 2004/0130965 A1* | 7/2004 | Achkire et al. | 366/152.2 |
| 2004/0151062 A1* | 8/2004 | Yao et al. | 366/137 |
| 2004/0198190 A1* | 10/2004 | Basol et al. | 451/41 |

OTHER PUBLICATIONS

Lo, S., "Physical Properties of Water wit IE Structures", Modem Physics Letters B, (1996) vol. 10, No. 19, pp. 921-930.

Resnick et al., "A Study of Cleaning Performance and Mechanisms in Dilute SC-1 Processing", Materials Research Society (1995) vol. 386, pp. 21-26.

Hall et al., "Effect of Sc-1 Process Parameters on Particle Removal and Surface Metallic Contamination", Materials Research Society (1995) vol. 386, pp. 127-133.

Kern, "Handbook of Semiconductor Wafer Cleaning Technology", Noyes Publications (1993), pp. 76-81.

Gray, Bill, M.D., "Homeopathy, Science or Myth: Physics of Potentized Water?", North Atlantic Books (May 1, 2005) vol. 21, No. 8, pp. 63, 65 and 67.

Boericke, William, M.D.., Pocket Manual of Homeopathic Materia Medica: The Characteristic and Guiding Symptoms of All Remedies:, Jain Publishers, ANAND Offset Press, New Delhi-I10016, $9^{th}$ Edi., (1975).

Suraj Puri, U.S. Appl. No. 11/093,904, OA Mailing Date: Mar. 4, 2009, filed Mar. 29, 2008.

Suraj Puri, Final Office Action, U.S. Appl. No. 11/093,904, Mailing Date: Nov. 13, 2008, filed Mar. 29, 2008.

Suraj Puri, Office Action, U.S. Appl. No. 11/093,904, OA Mailing Date: Oct. 15, 2008, filed Mar. 29, 2008.

Suraj Puri, U.S. Appl. No. 11/093,904, OA Mailing Date: Oct. 7, 2009 Filed Mar. 29, 2008.

Suraj Puri—U.S. Appl. No. 11/093,904, OA mailed Mar. 11, 2008, filed Mar. 29, 2005.

Suraj Puri—U.S. Appl. No. 10/886,785, Notice of Allowance dated Sep. 30, 2009, filed Jul. 7, 2004.

Suraj Puri—U.S. Appl. No. 10/886,785, Allowed claims based on Notice of Allowance dated Sep. 30, 2009, filed Jul. 7, 2004.

Suraj Puri—U.S. Appl. No. 10/886,785, filed, Office Action mailed Jun. 24, 2009, filed Jul. 7, 2004.

Suraj Puri—U.S. Appl. No. 10/886,785, Office Action dated Sep. 25, 2007, filed Jul. 7, 2004.

Suraj Puri—U.S. Appl. No. 10/886,785, Office Action dated Feb. 20, 2009, filed Jul. 7, 2004.

Suraj Puri—U.S. Appl. No. 10/886,785, Office Action dated Nov. 6, 2008, filed Jul. 7, 2004.

Suraj Puri—U.S. Appl. No. 10/886,785, Advisory Office Action dated Sep. 8, 2008, filed Jul. 7, 2004.

Suraj Puri—U.S. Appl. No. 10/886,785, Final Office Action dated Jun. 12, 2008 filed Jul. 7, 2004.

Suraj Puri—U.S. Appl. No. 12/503,302, Office Action mailed Nov. 25, 2009-Jul. 15, 2009.

Suraj Puri—U.S. Appl. No. 12/503,262, Supp Office Action mailed Dec. 3, 2009, filed Jul. 15, 2009.

Suraj Puri—U.S. Appl. No. 12/503,262, Supp Office Action mailed Nov. 17, 2009, filed Jul. 15, 2009.

Suraj Puri—PCT Application No. PCT/US05/36892 International Search Report completed Feb. 9, 2007, International filed Oct. 12, 2005.

Suraj Puri, PCT Application No. PCT/US05/36892 IPER, Apr. 17, 2007, International filing date Oct. 12, 2005.

Suraj Puri—Written Opinion, PCT/US2005/024366, completed Nov. 28, 2005, Int'l filing Jul. 7, 2005.

Suraj Puri—PCT Application No. PCT/US05,024366, IPER Dated Jan. 9, 2007, Int'l filing Jul. 7, 2005.

Perry's Chemical Engineers, Handbook, 1997, $7^{th}$, Edition, pp. 8-74 through 8-78. (1997).

* cited by examiner

Figure 1A

After Cleaning

SYSTEMS AND METHODS FOR SINGLE INTEGRATED SUBSTRATE CLEANING AND RINSING

RELATED APPLICATION

This patent application is a continuation-in-part (CIP) application to U.S. patent application Ser. No. 10/866,785, filed on Jul. 7, 2004, now U.S. Pat. No. 7,655,094, and entitled "SYSTEMS AND METHODS FOR CHARGING A CLEANING SOLUTION USED FOR CLEANING INTEGRATED CIRCUIT SUBSTRATES," which is incorporated by reference for all purposes. The patent application is a divisional (DIV) application to U.S. patent application Ser. No. 11/093,904, filed on Mar. 29, 2005, now U.S. Pat. No. 7,731,800, and entitled "SYSTEMS AND METHODS FOR SINGLE INTEGRATED SUBSTRATE CLEANING AND RINSING," which is incorporated by reference for all purposes.

FIELD OF THE INVENTION

The present invention relates to systems and methods for effectively cleaning integrated circuit ("IC") substrates. More particularly, the present invention relates to systems, methods and compositions for effectively cleaning and rinsing a single IC substrate using a charged solution, which contains solute particles in cluster form as solute clusters.

BACKGROUND OF THE INVENTION

During the integrated circuit ("IC") manufacturing process, contaminants, such as particles, photoresist residue and the like, are introduced on the IC substrate surface. It is important to eliminate or reduce the presence of these contaminants as they adversely impact the performance and function of the IC that is ultimately produced. Accordingly, various cleaning methods have been implemented to remove such undesirable contaminants. Such cleaning methods typically clean the IC substrates, which are undergoing processing, either one substrate at a time or clean a number of IC substrates simultaneously in a single cleaning cycle. In the context of cleaning semiconductor wafers, cleaning one wafer at a time is known as single wafer cleaning and it involves cleaning a single semiconductor wafer during a single cleaning cycle. In contrast, cleaning many semiconductor wafers simultaneously during a single cleaning cycle is known as batch wafer cleaning. Of these two types of cleaning methods, single wafer cleaning has emerged as a more desirable cleaning method for many processing steps in IC fabrication and particularly for 300 mm semiconductor wafer fabrication.

A cleaning chemistry commonly used in the single wafer cleaning technology employs a relatively low concentration of ammonium hydroxide solution known as the Standard Cleaning Solution 1 (the "SC-1 solution"). In the relatively low concentrations of SC-1 solution for single wafer cleaning, typically heated ammonium hydroxide, hydrogen peroxide and deionized water are present in a volume ratio of approximately 1:1:500. During cleaning, the SC-1 solution contacts the wafer surface in the presence of megasonic energy. It is believed that the SC-1 solution detaches contaminants from the substrate surface through surface etching and that the megasonic energy further removes the detached contaminant from the substrate surface. Although this method has been the cleaning method of choice for most in the semiconductor industry during the last forty years, it suffers from several drawbacks.

Figure 1A:
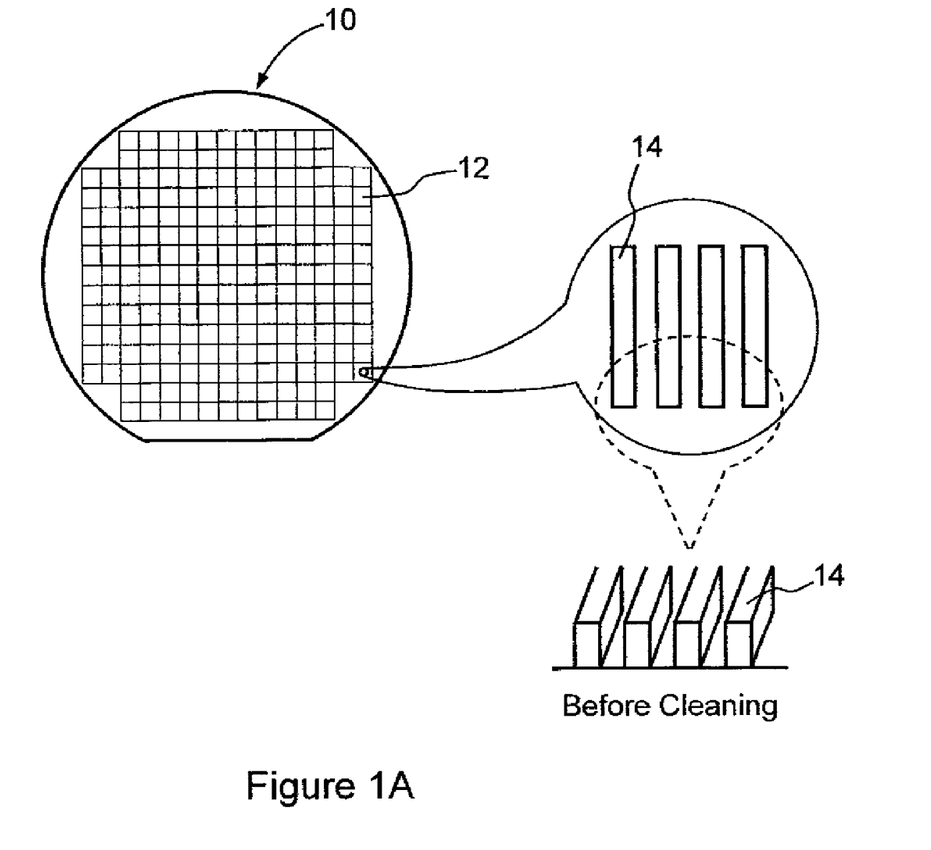
FIG. 1A shows a patterned semiconductor wafer surface having thereon regions where semiconductor chips are ultimately fabricated, which chips include poly silicon lines in an upright position.
Figure 1B:
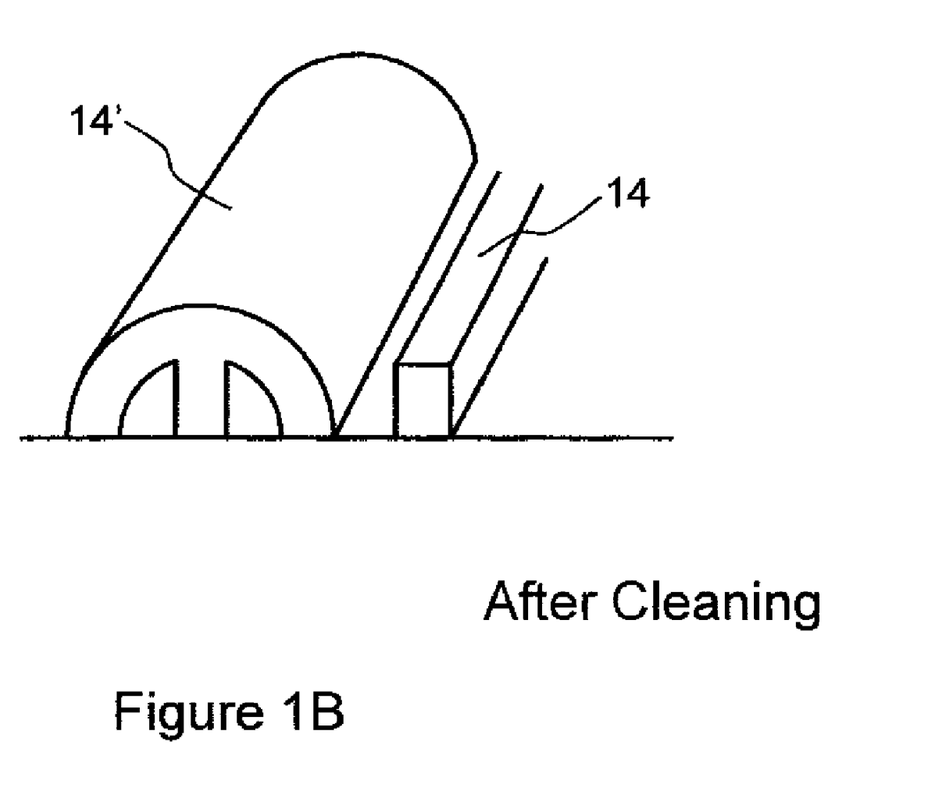
FIG. 1B shows the patterned semiconductor wafer surface of FIG. 1A after it has undergone cleaning according to conventional wafer cleaning methods, and as a result, has neighboring poly silicon lines collapsed into each other.

For example, conventional cleaning solutions run the risk of unduly etching and further degrading features on the semiconductor wafer surface. Such degradation is explained in greater detail by way of example hereinafter. FIG. 1A shows a partially fabricated semiconductor wafer surface 10 having defined thereon regions 12, where a semiconductor chip is ultimately fabricated. Each region 12 includes poly silicon lines 14, which may serve as a gate electrode for a semiconductor transistor. A perspective view of poly silicon lines 14 in FIG. 1A shows that they are disposed on the wafer surface as upright tower-like structures. Each such poly silicon tower is separated from its adjacent or neighboring poly silicon tower by a distance "d." Currently in the IC fabrication technology, with features approaching progressively smaller sizes, a distance "d" separating two poly silicon towers of about 65 nm or less is of particular interest. Unfortunately, cleaning single wafers, which have poly silicon geometries that are about 65 nm or less, one at a time using conventional methods, such as by SC-1 solution, leads to feature degradation, i.e., neighboring poly silicon towers 14 collapse on each other. FIG. 1B shows that poly silicon towers 14', which are shown in their upright position in FIG. 1A and denoted by reference numeral 14, collapse on their neighboring poly silicon tower. Collapsed poly silicon towers 14' short circuit the chip circuitry, rendering the entire chip inoperable. Consequently, the conventional cleaning techniques deal a devastating blow to the yield of patterned wafers having poly silicon geometries that are about 65 nm or less.

It is not entirely clear exactly why the poly silicon towers on the wafer surface collapse during cleaning. It is believed that the surface tension caused by the cleaning solution between the towers and the megasonic energy may be at least partially responsible. It is also believed that during cleaning, the effective concentration of the active cleaning agent, i.e., ammonium hydroxide in the SC-1 solution or hydro fluoric acid present in other cleaning chemistries, etch away an oxidized protective layer of native silicon dioxide, which coats the poly silicon towers, and makes the underlying poly silicon structure vulnerable to attack by the active cleaning agent. The active cleaning agent reacts with and weakens the poly silicon structures and at least partially contributes to the collapse shown in FIG. 11B.

What is therefore needed are novel systems, methods and compositions for single wafer cleaning technology, which do not suffer the drawbacks encountered by conventional cleaning and effectively clean IC substrate surfaces having the current and future miniature poly silicon geometries.

SUMMARY OF THE INVENTION

To achieve the foregoing, the present invention provides systems and methods for effectively charging a solution before using it for cleaning the integrated circuit ("IC") substrate. Charging a solution impacts the distribution of the solute particles throughout the solution. Specifically, in a charged solution, the solute particles are arranged in cluster form and exist as solute clusters. By way of example, each cluster can contain an average of between about 100 and about 200 solute molecules. In sharp contrast, in conventional cleaning solutions, the solute particles are distributed randomly, and not in cluster form.

While wishing not to be bound by theory, the solute clusters in a charged solution of the present invention provide an effective removal mechanism for the detached contaminant particle from the substrate surface. It is believed that the solute clusters trap the contaminant particles, which are initially detached from the substrate surface from the application of acoustic energy and/or by the presence of the solute clusters. In the absence of such solute clusters, as is the case with conventional cleaning solutions, it is believed that there exists no mechanism to trap the detached particles, which subsequently land on and adhere to the substrate surface.

The present invention recognizes, in accordance with one embodiment, that applying acoustic energy to relatively dilute solutions promotes charging. For example, charging can be accomplished by applying acoustic energy to dilute solutions, where the solute is present in the solvent at a volume ratio that is between about $1\times10^{-24}$:1 and about $1\times10^{-3}$:1. Such dilute solutions may cover solute concentrations in the ultra dilute regime and at "near zero dilutions." When a solute is present in a solvent at a volumetric ratio that is between about $3\times10^{-5}$:1 and $1\times10^{-6}$:1, the dilution of the resulting solution is considered to be in the ultra dilute regime. Furthermore, the term "near zero dilution," as used in this specification, refers to dilutions where the solute is present in the solvent at a volumetric ratio that is between about $1\times10^{-6}$:1 and $1\times10^{-24}$:1.

Regardless of whether the dilution of the solute is in the ultra dilute regime or at near zero dilution, the teachings of the present invention allow for effective cleaning of the substrate, without suffering from the drawbacks encountered when using concentrated or dilute conventional cleaning solutions. In fact, given that relatively dilute solutions are desirable for charging, i.e., forming solute clusters, solutions having "near zero dilutions" are preferred in certain applications of the present invention. Use of "near zero dilutions" for cleaning substrates goes against conventional wisdom because conventional cleaning techniques require higher concentrations of the solute to facilitate particle removal through a reaction mechanism. As explained above, the particle removal mechanism of the present invention is primarily focused on promoting solute cluster formation, and not focused on promoting the reaction between the solute and the substrate surface.

In one aspect, the present invention provides a method for cleaning a patterned integrated circuit substrate. The method includes: (1) providing the patterned integrated circuit substrate having thereon poly silicon lines adjacent to each other; (2) charging a solution, which contains at least a solute selected to promote cleaning of the patterned integrated circuit substrate, to produce a charged solution, wherein at least a portion of the solute is present as clusters in the charged solution; and (3) conveying the charged solution for cleaning the patterned integrated circuit substrate. The patterned integrated circuit substrate, in one embodiment of the present invention, has adjacent poly silicon lines separated from each other by a distance "d," which is about 65 nm or less.

In accordance with one embodiment of the inventive methods, the charging is carried out by vibrating the solution, which is effected by a megasonic energy. The solute can be any one member selected from a group consisting of $O_3$, HCl, $H_2O_2$, $NH_4OH$ and HF. Preferably, however, the solute is ammonium hydroxide. An average number of molecules of the solute in the clusters may be between about 100 and about 200 molecules per cluster.

The charging step described above, in one embodiment of the present invention, includes diluting the solution such that the solute is present in a solvent in a volumetric ratio that is between about $1\times10^{-3}$:1 and about $1\times10^{-24}$:1. In preferred embodiments, however, the solute is present in the solvent in a volumetric ratio that is between about $5\times10^{-5}$:1 and about $1\times10^{-24}$:1, and in more preferred embodiments, the solute is present in the solvent in a volumetric ratio that is between about $1\times10^{-6}$:1 and about $1\times10^{-24}$:1.

The method described above may further include: (1) diluting the charged solution to produce a cleaning solution; and (2) using the cleaning solution for cleaning the patterned integrated circuit substrate. In this embodiment of the present invention, in the cleaning solution, the solute is present in a solvent in a volumetric ratio that is between about $5\times10^{-5}$:1 and about $1\times10^{-24}$:1. The step of using mentioned in this embodiment may include applying acoustic energy to the cleaning solution for removing contaminant particles from the patterned integrated circuit substrate. In other embodiment, the method of the present invention may further include applying acoustic energy for the charging step. The method may further still include cleaning the patterned integrated circuit substrate by applying the acoustic energy to the charged solution and then applying the charged solution to the patterned integrated circuit substrate.

The inventive methods described herein may further include mixing a solvent, e.g., deionized water, and the solute to produce the solution before the charging the solution. The mixing may produce the solution having the solute present in the solvent in a volumetric ratio that is between about $3\times10^{-5}$:1 and about $1\times10^{-24}$:1. The patterned integrated circuit substrate may be cleaned at about 30° C. or below 30° C. One described embodiment of the inventive cleaning method further includes cleaning the patterned integrated circuit substrate by applying ozonated water to the patterned integrated circuit substrate. In preferred embodiments, ozonated water and a charged solution are alternatively applied to a wafer surface during a single cleaning cycle until the wafer is clean.

In another aspect, the present invention provides a system for cleaning patterned integrated circuit substrates. The system includes: (1) a charging chamber for holding a solution, which contains at least a solute selected to promote cleaning of the patterned integrated circuit substrate; (2) a first acoustic energy source capable of vibrating the solution in the charging chamber to produce a charged solution, wherein at least a portion of the solute is present as clusters in the charged solution; and (3) a cleaning assembly for cleaning the patterned integrated circuit substrate by applying the charged solution to a surface of the patterned integrated circuit substrate.

In preferred embodiments, the system further includes a processing chamber which contains the cleaning assembly. In certain of these preferred embodiments, the cleaning assembly contains a first nozzle for spraying the charged solution on the patterned integrated circuit substrate. The cleaning assembly may also contain a second nozzle for spraying ozonated water on the patterned integrated circuit substrate. The inventive cleaning systems may further include a mixing chamber for mixing a solvent and the solute to produce the solution. For conveying the charged solution from the charging chamber to the processing chamber, the inventive systems may include a second connection between the charging chamber and the processing chamber. Similarly, for diluting the charged solution before it enters the processing chamber, the inventive systems may also include a first connection between a solvent reservoir and the second connection.

In yet another aspect, the present invention provides a method for rinsing a patterned integrated circuit substrate. The rinsing method includes: (1) providing a patterned integrated circuit substrate having thereon poly silicon lines adjacent to each other; (2) cleaning the patterned integrated circuit substrate; (3) charging a solution, which contains at least a solute selected to promote cleaning of the integrated circuit substrate, to produce a charged solution, wherein at least a portion of the solute is present as clusters in the charged solution; and (4) conveying the charged solution for rinsing the integrated circuit substrate.

The charges solution for rinsing may contains the solute (e.g., $O_3$, HCl, $H_2O_2$, $NH_4OH$ and HF) in deionized water. In accordance with one embodiment of the present invention, a concentration of the solute in the charged solution is between about $1\times10^{-3}:1$ and $1\times10^{-24}:1$.

DETAILED DESCRIPTION OF THE INVENTION

The present invention provides systems, methods and compositions for effectively cleaning integrated circuit (IC) substrates. Conventional wisdom dictates that for effectively cleaning IC substrates, high enough concentrations of the solute, which is typically an active cleaning ingredient in the cleaning solution, should be used. According to such wisdom, it is believed that high concentrations of the solute react with the substrate surface to detach contaminant particles therefrom. Predicated on this belief, conventional wisdom teaches away from using cleaning solutions with relatively low solute concentrations.

In the present invention, however, relatively low solute concentrations of the solute are preferred in certain embodiments because they promote charging of a solution. It is believed that in a charged solution, solute particles, which are arranged as clusters, facilitate detaching contaminant particles from the substrate surface and are also responsible for trapping the detached contaminant particle for effective removal from the substrate. As a result, the present invention focuses on forming solute clusters for effective cleaning of IC substrates. Notably, the inventive cleaning systems and methods described herein not only provide a way to clean substrates using relatively low solute concentrations, which are deemed ineffective in conventional cleaning, rather in certain instances, such low solute concentrations represent preferred embodiments of the present invention.

Figure 2:
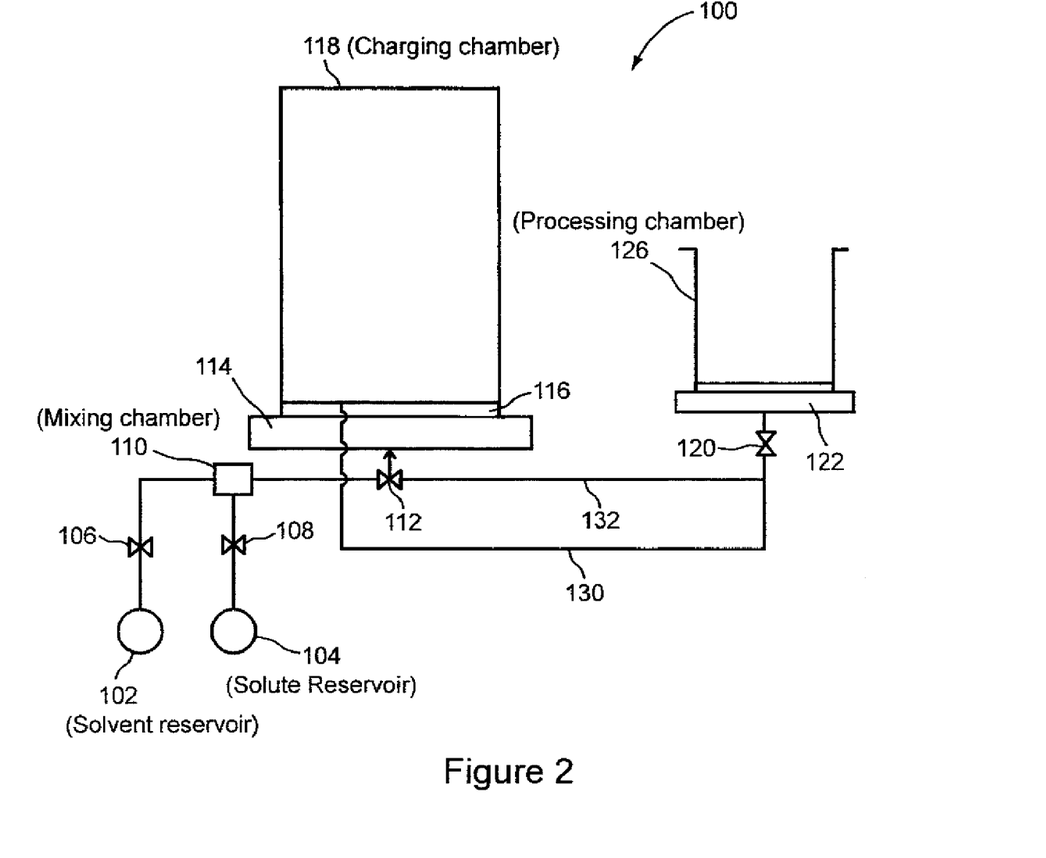
FIG. 2 shows a single wafer cleaning system, according to one embodiment of the present invention, which uses a charged solution for cleaning the wafer surface.

FIG. 2 shows a cleaning system 100, according to one embodiment of the present invention, for effectively cleaning IC substrates. System 100 has three chambers—a mixing chamber 110 for mixing a solute and a solvent to form a solution, a charging chamber 118 for charging the solution and a processing chamber 126 for cleaning using the charged solution the single IC substrate, one substrate at a time during a single cleaning cycle. Each of mixing chamber 110 and charging chamber 118 connect through separate connections to processing chamber 126. Specifically, a first connection 132 connects mixing chamber 110 to processing chamber 126 and a second connection 130 connects charging chamber 118 to processing chamber 126. As will be explained below, first connection 132 can also be used to convey a solvent from its reservoir directly to processing chamber 126.

Figure 3:
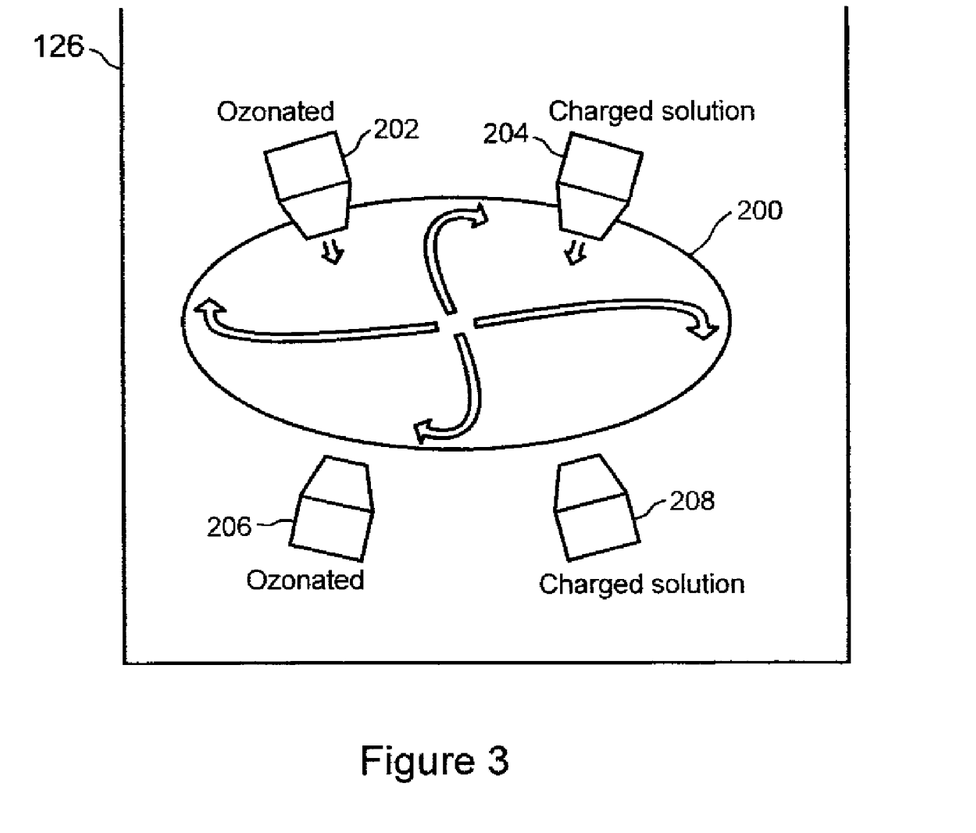
FIG. 3 shows in greater detail major components in a processing chamber of a single wafer cleaning system, according to one embodiment of the present invention.

Mixing chamber 110 receives a solvent stream from a solvent reservoir 102 and a solute stream from a solute reservoir 104 through valves 106 and 108, respectively. A valve 112 is activated to convey the contents of mixing chamber 110 to charging chamber 118. Charging chamber 118 comes equipped with a first acoustic energy source 114 and a coupling chamber 116 for coupling the continuous energy transmission into the charging chamber. Contents of mixing chamber 110 can also be emptied into processing chamber 126 through first connection 132 when valves 112 and 120 are activated. As shown in FIG. 2, solvent from solvent reservoir 102 can be conveyed through mixing chamber 110 and first connection 132 to processing chamber 126. Using a similar path, solvent from solvent reservoir 102 can also be conveyed through valve 106, mixing chamber 110 and first connection 132 to a location on the second connection where the charged solution is diluted, before it is introduced into processing chamber 126. Contents of charging chamber 118 are conveyed to processing chamber through second connection 130 when valve 120 is activated. Contents of charging chamber 118, mixing chamber 110, and solvent reservoir 102 are introduced into processing chamber through nozzle 204, which is shown in FIG. 3 and explained in greater detail below.

Similar to charging chamber 118, processing chamber 126, need not be, but may also be fitted with a second acoustic energy source 122 and a coupling chamber 124 for coupling the continuous energy transmission into processing chamber 126. As will be explained in greater detail below with reference to FIG. 3, processing chamber 126 cleans using the charged solution one wafer at a time during a single cleaning cycle.

Mixing chamber 110 may be any equipment known in the art that can controllably combine a flow of at least one liquid with a flow of at least one gas. Charging chamber 118 can be made of any material known to be a good transmitter of acoustic energy. Similarly, in those embodiments where processing chamber 126 is fitted with megasonic as shown in FIG. 2, processing chamber 126 can be made of any material known to be a good transmitter of acoustic energy. Such chambers are preferably made from quartz. Although FIG. 2 describes three chambers as three separate vessels, it is possible that the three chambers could be incorporated into two vessels or a single vessel. The preferred embodiment, however, is to have three separate vessels as shown in FIG. 2.

Acoustic energy sources 114 and 122 can be any source that supplies megasonic energy and the like. Charging chamber 118 and processing chamber 126 are ideally placed above their corresponding acoustic energy sources and their coupling chambers. Use of megasonic energy is preferred because it is believed to be more effective at facilitating removal of smaller particles from the substrate surface. Although the megasonic device used in system 100 can have outputs as high as 5 Watts/cm$^2$ and higher, it is preferable to use an output of 3 Watts/cm$^2$ and lower. Suitable equipment for generating megasonic energy is commercially available from a variety of vendors. Such equipment should, however, preferably include a generator and a series special transducers or the like. By way example, megasonic devices, which are commercially available from Kaijo Corporation of Japan and PCT Systems, Inc. of Fremont, Calif. work well.

FIG. 3 shows the major components in processing chamber 126, according to one preferred embodiment of the present invention, to effect cleaning of a single wafer during a single cleaning cycle. As shown in this figure, a wafer 200 is secured on a chuck (not shown to simplify illustration), which is capable of rotating the wafer any speed ranging between about 10 revolutions per minute (rpms) and about 1000 rpms. In one embodiment, two nozzles 202 and 204 are disposed above top surface of wafer 200 and two nozzles 206 and 208 are disposed beneath the bottom surface of wafer 200. Nozzle 202 sprays ozonated water and nozzle 204 sprays charged solution, which is conveyed to it from charging chamber 118. As explained above, nozzle 204 can also spray contents from mixing chamber 110 and solute reservoir 102, if necessary. In corresponding fashion, nozzle 206 sprays ozonated water on the bottom surface and nozzle 208 sprays charged solution on the bottom surface. Those skilled in the art will recognize that it is not necessary to have nozzles 206 and 208 and that it is enough to have nozzles 202 and 204, which spray on the top surface. Furthermore, one or more than two nozzles can be used to carry out what is being accomplished by nozzles 202 and 204 in FIG. 3.

The megasonic may be disposed inside processing chamber 126 in many different configurations. The configuration shown in FIG. 2 is one example. In another example, the megasonic energy can be supplied to wafer 200 from the wafer chuck, upon which the wafer is secured. In this embodiment, the chuck comes equipped with the megasonic. In preferred embodiments, however, the nozzle (e.g., nozzle 204 of FIG. 3) which sprays the charged solution on the top surface of wafer 200, is equipped with the megasonic. As a result, the charged solution is charged to a greater extent as it is discharged from the nozzle.

Although in FIG. 3, one IC substrate 128 is shown inside processing chamber 126, those skilled in the art will recognize that in certain embodiments, processing chamber 126 can be designed to hold more than one substrate or a cassette of many substrates. In preferred embodiments, however, processing chamber 126 cleans one IC substrate at a time in series.

A typical cleaning process in system 100 begins when a solvent, typically deionized water, stored in solvent reservoir 102 flows to mixing chamber 110 by activating valve 106. Similarly, a solute from solute reservoir 104 enters the same chamber 110 via valve 108 so mixing may commence to form a solution. Solute reservoir 104 may contain any solute that facilitates removal of a particulate and metallic contaminants from the substrate surface. In certain embodiments of the present invention, solute reservoir 104 contains ammonium hydroxide as either a concentrated solution in liquid form or as an aqueous solution. In a preferred embodiment, solute reservoir 104 contains ammonia gas, which allows the use of ammonium hydroxide in extremely low concentrations. In such preferred embodiments, before mixing ammonia gas with deionized water, ammonia gas is filtered to bring its purity to about 99.99999%. Those skilled in the art will recognize that depending on the type of particulate contaminants to be removed from the substrate surface, other types of solutes, different from ammonium hydroxide, may be used. By way of example, a solution includes other chemicals, such as $O_3$, $HCl$, $H_2O_2$, $NH_4OH$ and $HF$. These solutes are usually mixed with deionized water to a solution which is subsequently used for cleaning. Alkaline based solutions tend to remove particles of silicon, carbon, and their derivatives. Acid based solutions, such as that made using HCl, remove metal contaminants from the substrate surface. In those embodiments where ammonium hydroxide is used, the volumetric ratio of ammonium hydroxide to deionized water is generally between about $3 \times 10^{-5}:1$ and about $1 \times 10^{-24}:1$, and preferably between about $1 \times 10^{-6}:1$ and about $1 \times 10^{-24}:1$.

By activating valve 112, the solution formed in mixing chamber 110 is conveyed to charging chamber 118. An acoustic energy source 114, preferably a megasonic device, through a coupling chamber 116 supplies sufficient energy to charge the solution to create a coherent solution inside charging chamber 118. As a result, inside chamber 118, a relatively dilute solution is transformed from an uncharged state to a charged state by the aid of a megasonic device.

Figure 4A:
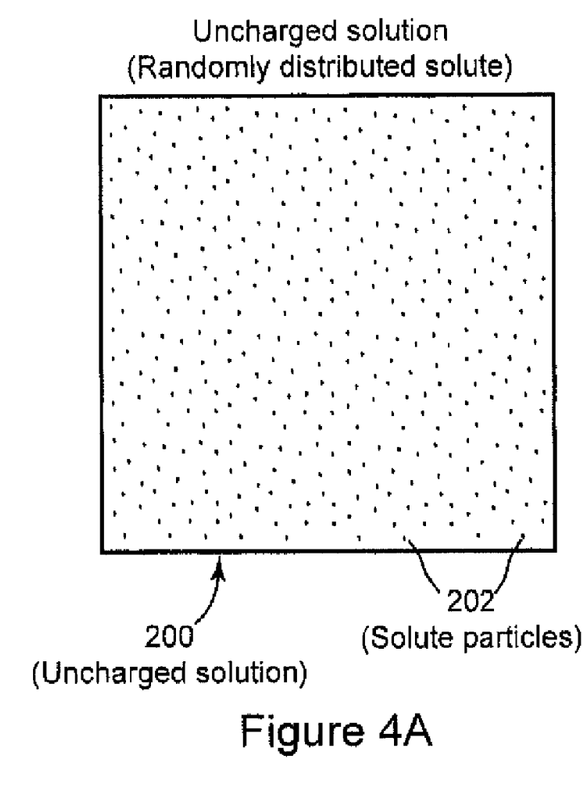
FIG. 4A shows randomly arranged solute particle in conventional cleaning solutions.
Figure 4B:
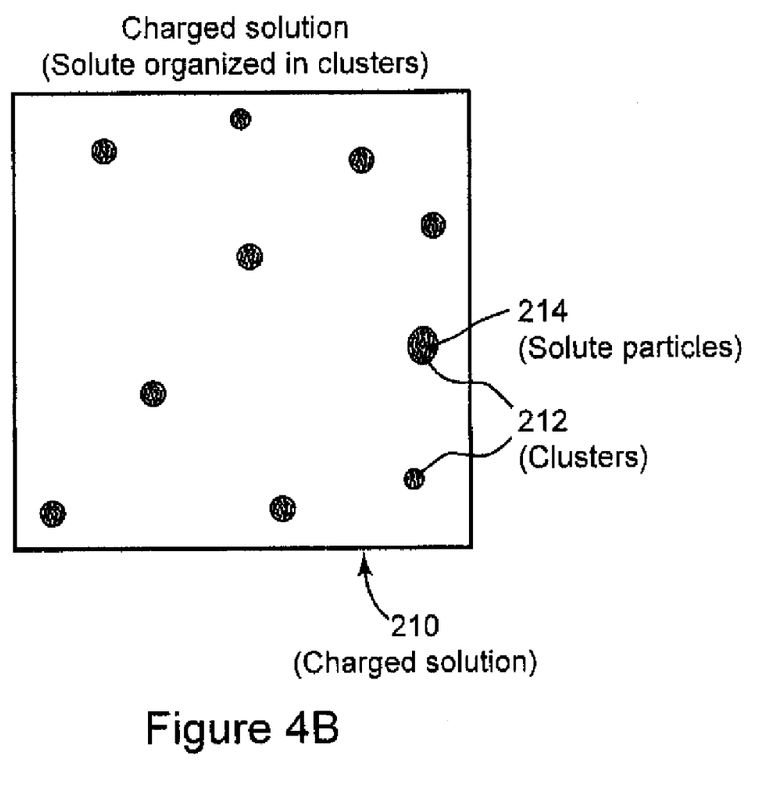
FIG. 4B shows the solute particles arranged in cluster form in a charged solution, according to one embodiment of the present invention.

FIGS. 4A and 4B illustrate the difference in solute particle distribution from a solution's uncharged state to a charged state. In FIG. 4A, which shows an uncharged solution 200, solute particles 202 are randomly distributed throughout solution 200. In FIG. 4B, which shows a charged solution 210, solute particles 214 are organized in solution 210 as clusters 212. In a preferred embodiment of the present invention, an average number of molecules of solute 214 in clusters 212 is between about 100 and about 200 molecules per cluster. Those skilled in the art will recognize that in each of solutions 200 and 210, the solute particles are dissolved in a solvent, which is not shown in FIGS. 4A and 4B to simplify illustration and facilitate discussion. Furthermore, clusters 212 need not have a circular shape with a smooth exterior, as shown in FIG. 4B. Rather, clusters 212 are generally of any irregular shape.

Although cluster formation is predominant at 0° C., cleaning inside processing chamber 126 should be carried out at about 30° C. or below 30° C. (preferably at room temperature). Test data obtained from various experiments suggests that at room temperature or at about 30° C., there are sufficient number of solute molecules within the clusters to detach and trap the detached contaminant particles from the substrate surface and provide the necessary electromotive force ("EMF") for holding onto such particles. At higher temperatures, cluster formation appear to melt away and only a few molecules are left within a very small cluster. Consequently, substrate cleaning is more effective at around room temperature than at relatively higher temperatures.

The charged solution exiting charging chamber 118 has solute present in the solvent in a volumetric ratio that is between about $1 \times 10^{-3}:1$ and about $1 \times 10^{-24}:1$, preferably between about $5 \times 10^{-5}:1$ and about $1 \times 10^{-24}:1$, and more preferably between about $1 \times 10^{-6}:1$ and about $1 \times 10^{-24}:1$.

By activating valve 120, some of the charged solution is introduced through first connection 130 and nozzle 204 (shown in FIG. 3) into processing chamber 126 for cleaning substrate 128. Although only one inlet to process chamber 126 is shown in FIG. 2, those skilled in the art will recognize that if more than one stream of solution is required for cleaning then additional inlets to chamber 126 can be provided.

Processing chamber 126 may also come equipped with a drain valve and drain line (not shown to simplify illustration) to dispense the effluent stream. Cleaning of the substrate occurs by causing the charged solution to contact the surface. This may be accomplished by spraying the solution onto the surface. In those embodiments of the present invention where higher concentration of the solute particles in the charged solution is desirable, the solute is present in the solvent at a concentration that ranges between $1 \times 10^{-3}:1$ to $1 \times 10^{-6}:1$. For such desirable high concentrations, the concentration of the solute particles in the solvent preferably ranges from between about $2 \times 10^{-4}:1$ to about $1 \times 10^{-6}:1$, more preferably the solute concentration is between about $2 \times 10^{-6}:1$ to about $1 \times 10^{-6}:1$. In those embodiments of the present invention where lower concentration of the solute particles in the charged solution are desirable, such concentrations range from between about $1\times10^{-6}:1$ and $1\times10^{-24}:1$, preferably the concentration ranges from between about $1\times10^{-8}:1$ and $1\times10^{-24}:1$. As a result, the effective concentration range of the solute particle in the charged solution spans a range from between about $1\times10^{-3}:1$ and $1\times10^{-24}:1$. Those skilled in the art will recognize that it is difficult to measure very dilute concentration ranges, particularly the concentrations that are $1\times10^{-24}$ and less. While wishing not to be bound by theory, at such very low concentrations and even lower concentrations when a few solute molecules are present in the solvent, it is believed that the charging solution effectively cleans the wafer surface.

In preferred embodiments as shown in FIG. 2, system 100 is designed to charge to a greater extent a charged solution stream flowing out of charging chamber 118. First connection 132 facilitates diluting this charged solution using more solvent from solvent reservoir 102 and conveying it to the charged solution inside second connection 130, before it is introduced through nozzle 204 inside processing chamber 126. Specifically, by activating valves 106 and 112 such solvent is provided from solvent reservoir 102 to the charged solution within second connection 132. In such dilute charged solution, solute is present in a solvent in a volumetric ratio that is between about $5\times10^{-5}:1$ and about $1\times10^{-24}:1$. This preferred embodiment, provides the flexibility of using small amounts of charged solution residing in charging chamber 118 and further diluting it to produce a more effectively charged solution.

Although not shown in FIG. 2, charging chamber 118 can be fitted with a recirculation scheme having one more chambers arranged to recirculate the charged solution. In each such chamber, progressive dilutions of the charged solution are possible. The above-described scheme allows effective dilutions of charged solutions having relatively low concentrations of the solute. The flow schemes described above for mixing, charging and cleaning can be carried out in continuous mode, batch and semi-batch mode.

During a single cleaning cycle, in one embodiment of the present invention wafer 200 of FIG. 3 undergoes cleaning by repetitive use of ozonated water and the charged solution. Wafer cleaning is effected by alternatively spraying ozonated water and the charged solution on the wafer surface(s) for a few seconds, a cycle that can be repeated as many times as necessary until the surface(s) attain the required level of cleanliness. By way of example, each of ozonated water and charged solution can be sprayed on the wafer surface alternatively and each duration of the spray can be between about 5 seconds and about 10 seconds until the wafer is clean. After wafer cleaning has concluded, the wafer surface(s) may be rinsed by deionized water, according to one embodiment of the present invention as described in greater detail below. Subsequent to the deionized water rinse of the wafer surface, the wafer surface is typically dried in nitrogen atmosphere to prevent spot formation on the patterned wafer.

Those skilled in the art will recognize that inside processing chamber 126 of FIG. 2, the wafer surface can be cleaned by submerging the wafer surface in an appropriate cleaning solution or flowing the charged solution past the wafer surface. In such embodiments, acoustic energy typically from a megasonic is applied to the charged cleaning solution, while the charged cleaning solution is applied to the wafer surface.

The present invention represents a marked improvement over the conventional systems, methods and compositions for cleaning IC substrates. The upright poly silicon lines shown in FIG. 1A which collapse as a result of conventional cleaning, undergo minimal or no collapsing when inventive systems, methods and compositions are used for cleaning the wafer surface. In other words, after cleaning a wafer surface with inventive systems, methods and compositions, the poly silicon lines for the most part remain in their upright position as shown in FIG. 1A.

As explained above, the present invention prefers use of charged solutions, which can have relatively low concentrations of the solute, i.e., dilutions in the ultra-dilute regime or having "near zero dilutions," for effective cleaning. Consequently, low concentrations do not etch away the native silicon dioxide and, therefore, the underlying poly silicon structure is not vulnerable to attack from the solute. Moreover, the solute, which is already at a relatively low concentration in the charged solution, does not attack the poly silicon lines.

Furthermore, the ability to operate under such low concentrations, allows the cleaning systems and methods of the present invention to be environmentally green. In other words, they do not require the additional expense of equipment and labor to treat the effluent stream before draining, which is required by the conventional cleaning systems and methods. Moreover, in the cleaning system and methods according to the present invention, the significant cost associated with disposing chemicals is eliminated.

According to conventional cleaning methods, the solute concentration is heated to facilitate substrate etching for particle removal. This requires substantial time and equipment. The solute in the present invention, however, effectively cleans at room temperature conditions and does not require such heating. The present invention, therefore, obviates the need for heating equipment and additional processing time.

As explained above, conventional cleaning systems and methods rely upon concentrated solution to etch the substrate surface and thereby remove particulate contaminants. The conventional cleaning, therefore, introduces undesired surface roughness that degrades the electrical performance of the ultimately produced IC. In the present invention, however, the IC substrates can be cleaned using charged solutions having low concentrations of the solute. In other words, given that very small quantities of chemicals are being used for cleaning, the substrate surface is unetched. Another advantage of using small quantities of chemicals is that no residue of stabilizers and metal contaminants remain on the substrate surface. In other words, substrates cleaned according to the present invention have little or no stabilizer residue and metal contaminants thereon because chemicals in very small quantities are used during the cleaning process. A yet another advantage of using small quantities of chemicals is that there is no need for a pretreatment step before cleaning the substrate. The present invention, which can effectively clean substrates at "near zero dilutions," do not require an additional pretreatment step, such as ozonation, which is required by conventional cleaning techniques. This also translates into increased throughput when cleaning according to the present invention.

Substrate cleaning, according to the present invention, occurs very rapidly. By way of example, a single cleaning cycle takes between about 20 seconds and about 60 seconds. In those embodiments, where ozonated water and the charged solution are being sprayed on the wafer surface alternatively during a cleaning cycle, each of ozonated water and charged solution are sprayed any where from two (2) to four (4) times on the wafer surface. Consequently, the present invention provides a relatively higher throughput. Moreover, if a substrate surface is not sufficiently clean after a single cleaning cycle, then more than one cleaning cycle can be implemented to more effectively clean that surface, without degrading it. Multiple cleaning cycles in the present invention, actually improve the quality of the surface and do not introduce undesired surface roughness, stabilizers or metal contaminants, which are introduced when cleaning according to conventional methods is performed. Those skilled in the art will recognize that such multiple cleaning cycles in conventional cleaning typically destroys the substrate surface.

After a patterned semiconductor wafer has been cleaned, either according to conventional or the inventive methods, the wafer can be rinsed using a charged deionized water solution, according to one embodiment of the present invention. A separate tank or processing chamber 126 of FIG. 2 can be used to carry out the rinse cycle on the wafer. In the separate tank or in processing chamber 126 of FIG. 2, a charged deionized water solution is applied to the wafer surface. For example, the separate tank could be equipped with a nozzle similar to those shown in FIG. 3, which nozzle sprays the charged deionized water solution on the wafer surface. Similarly, in processing chamber 126 of FIG. 3, one of the nozzles or a separate nozzle could provide the charged deionized water to the wafer surface. The charged deionized water solution, according to the present invention, contains low concentrations of a cleaning agent, e.g., $O_3$, HCl, $H_2O_2$, $NH_4OH$ and HF. In such low concentrations of the charged deionized water solution, the ratio of the cleaning agent and the deionized water is between about $1 \times 10^{-6}:1$ and about $1 \times 10^{-24}:1$. The deionized water solution containing very low concentrations of a cleaning agent is charged, according to the present invention, using the appropriate acoustic energies (e.g., using a megasonic) as described above, before it is applied to the wafer surface. It is believed that the same principles underlying the use of a charged solution for cleaning a wafer surface can also be extended to rinsing that surface after cleaning has concluded. Clusters of the cleaning agent in the charged deionized water solution facilitate further cleaning of the wafer surface, without damaging that wafer surface.

Although certain examples have been described in terms of cleaning semiconductor wafers, those skilled in the art will recognize that the inventive systems, methods and compositions described herein can be used for other IC substrates. For example, the inventive systems, methods and compositions can be used for effective cleaning of masks, disks, flat panels, liquid crystal displays, thin film heads, photo masks, and lenses.

What is claimed is:

1. A system for cleaning a patterned integrated circuit substrate, comprising:
    a mixing chamber for mixing a solvent and a dissolved solute gas to produce a solution;
    a charging chamber, which is different than said mixing chamber, holding said solution;
    a first acoustic energy source vibrating said solution in said charging chamber to produce a charged solution including solute clusters, in which a solute is surrounded by a plurality of solvent molecules;
    a cleaning assembly that is different from said charging chamber and capable of cleaning said patterned integrated circuit substrate by applying said charged solution to a surface of said patterned integrated circuit substrate.

2. The system of claim 1, further comprising a processing chamber which contains said cleaning assembly.

3. The system of claim 2, further comprising a processing connection between said charging chamber and said processing chamber for conveying said charged solution from said charging chamber to said processing chamber.

4. The system of claim 3, further comprising a diluting connection between a solvent reservoir and said processing connection for diluting said charged solution before it enters said processing chamber.

5. The system of claim 2, further comprising a second acoustic energy source disposed at or near a bottom surface of said processing chamber.

6. The system of claim 5, wherein said second acoustic energy source has outputs which are 3 Watts/cm$^2$ or higher than 3 Watts/cm$^2$.

7. The system of claim 6, wherein said second acoustic energy source has outputs which are 5 Watts/cm$^2$ or higher than 5 Watts/cm$^2$.

8. The system of claim 2, wherein said processing chamber is configured to clean one said integrated circuit substrate at a time.

9. The system of claim 1, wherein said cleaning assembly contains a first nozzle for spraying said charged solution on said patterned integrated circuit substrate.

10. The system of claim 9, wherein said cleaning assembly contains a second nozzle for spraying ozonated water on said patterned integrated circuit substrate.

11. The system of claim 10, further comprising a second acoustic energy source and wherein said first and said second nozzles are equipped with said second energy source.

12. The system of claim 10, further comprising two nozzles in addition to said first and said second nozzles, and wherein said two nozzles are configured to spray a liquid on a bottom surface of said patterned integrated circuit substrate.

13. The system of claim 12, wherein said first and said second nozzle are configured to spray a liquid on a top surface of said patterned integrated circuit substrate.

14. The system of claim 10, further comprising two nozzles in addition to said first and said second nozzle, and wherein said two nozzles are configured to spray ozone on a bottom surface of the said patterned integrated circuit substrate and said first and said second nozzles spray said charged solution on a top surface of said patterned integrated circuit substrate.

15. The system of claim 1, further comprising a filter, and said solute is dissolved ammonia gas which is filtered to a purity of about 99.99999% using said filter before said ammonia gas is mixed with said solvent.

16. The system of claim 1, further comprising a recirculation subassembly, which is connected to said charging chamber and said recirculation subassembly includes one or more chambers, each of which is capable of recirculating said charged solution and capable of progressively diluting concentration of said charged solution in said charging chamber.

17. The system of claim 1, wherein said first acoustic energy source has outputs which are 5 Watts/cm$^2$ or higher than 5 Watts/cm$^2$.

18. The system of claim 1, wherein said first acoustic energy source has outputs which are 3 Watts/cm$^2$ or higher than 3 Watts/cm$^2$.

19. The system of claim 1, further comprising a chuck capable of securing said patterned integrated circuit substrate.

20. The system of claim 19, wherein said chuck is capable of rotating said patterned substrate at a speed ranging between about 10 revolutions per minute ("rpm") and about 1000 rpm.

* * * * *